United States Patent
Hsu et al.

(10) Patent No.: US 7,545,039 B2
(45) Date of Patent: Jun. 9, 2009

(54) STRUCTURE FOR REDUCING STRESS FOR VIAS AND FABRICATING METHOD THEREOF

(75) Inventors: Yung-Yu Hsu, Hsinchu (TW); Rong-Chang Feng, Hsinchu (TW); Ra-Min Tain, Hsinchu (TW); Shyi-Ching Liau, Hsinchu (TW); Ji-Cheng Lin, Hsinchu (TW); Shan-Pu Yu, Hsinchu (TW); Shou-Lung Chen, Hsinchu (TW); Chih-Yuah Cheng, Hsinchu (TW)

(73) Assignee: Industrial Technology Research Institute, Hsinchu (CN)

( * ) Notice: Subject to any disclaimer, the term of this patent is extended or adjusted under 35 U.S.C. 154(b) by 244 days.

(21) Appl. No.: 11/410,986

(22) Filed: Apr. 26, 2006

(65) Prior Publication Data
US 2007/0108572 A1    May 17, 2007

(30) Foreign Application Priority Data
Nov. 16, 2005    (TW)    ............................... 94140304 A

(51) Int. Cl.
*H01L 23/48*    (2006.01)
*H01L 23/52*    (2006.01)
*H01L 29/40*    (2006.01)

(52) U.S. Cl. ........................................ 257/750; 257/774
(58) Field of Classification Search .......... 257/750–766
See application file for complete search history.

(56) References Cited

U.S. PATENT DOCUMENTS

| | | | |
|---|---|---|---|
| 6,586,822 B1 | 7/2003 | Vu | |
| 6,586,836 B1 | 7/2003 | Ma et al. | |
| 6,759,750 B2 * | 7/2004 | Shue et al. | 257/758 |

* cited by examiner

*Primary Examiner*—Cuong Q Nguyen
(74) *Attorney, Agent, or Firm*—Harness, Dickey & Pierce PLC

(57) ABSTRACT

A structure for reducing stress for vias and a fabricating method thereof are provided. One or more wires or vias in the thickness direction are enframed with the use of a stress block in a lattice structure to be isolated from being directly contacted with the major portion of insulating materials with a high coefficient of thermal expansion. Thus, the shear stress resulting from temperature loading can be blocked or absorbed by the stress block.

5 Claims, 5 Drawing Sheets

STRUCTURE FOR REDUCING STRESS FOR VIAS AND FABRICATING METHOD THEREOF

CROSS-REFERENCE TO RELATED APPLICATIONS

This non-provisional application claims priority under 35 U.S.C. § 119(a) on patent application Ser. No(s). 094140304 filed in Taiwan, R.O.C. on Nov. 16, 2005, the entire contents of which are hereby incorporated by reference.

BACKGROUND OF THE INVENTION

1. Field of Invention

The invention relates to a stress block structure of an electronic packaging, and more particularly to a structure for reducing stress for vias and a fabricating method thereof.

2. Related Art

In recent years, as the demands of electronic products in speed and volume have increased dramatically, the amount of the input/output (I/O) pins and the power of the chips are increasing accordingly.

Taking memory as an example, the volume of early memory was 16M or 64M. Now, memory has been developed to the Double Data Rate II Synchronous Dynamic Random Access Memory (DDRII SDRAM) with a volume of 512M. Difficulties in the process and the reliability of products have increasingly emerged; therefore, in order to achieve a single die with high volume or a stacked packaging with multiple die, the requirements of high volume and high speed are reached by the use of different package structures. Therefore, the signal contacts (I/O) at the chip terminal enter the area array I/O pins through less peripheral I/O pins. Thus, during redistribution, a required wire line needs to be plated on the chip pad in the thickness direction (i.e. the lines of different layers are connected through the vias) before redistribution is carried out. The wire (i.e. the via) in the thickness direction can be designed being plated completely or with blind vias. However, during the process, lateral stress will be generated owning to the temperature applied according to the process requirements, or the temperature cycling experiment carried out for the reliability test after the package is completed, or even the thermal effect resulting from the operation of the device or element, therefore the wire in the thickness direction is bound to endure the lateral thermal stress resulting from the change in temperature in the above cases regardless of the design thereof. Herein, the main reason for the thermal stress includes structure design, material selection, and the like, wherein, the effect of the material parameters, for example the Young's Modulus (E) and the Coefficient of Thermal Expansion (CTE), of the material itself on the thermal stress is most significant. Since there are generally various kinds of materials in different kinds of electronic devices or elements, the mismatched thermal stresses in the interface areas of different materials will be caused by the difference in the temperature distribution and the CTE of different materials. Thus, the telecommunicating contact is destroyed, for example the breaking of the wire in the thickness direction, thereby causing problems with product reliability. However, the physical characteristics subject to the material cannot be changed and the materials compatible with the process which can be selected for use are limited. Therefore, how to extend the service life of the electronic device or element by the use of a preferred structure design has gradually become one of the important research subjects regarding the electronic device or element.

Conventionally, in an electronic device or element, an insulating material with a low E will be used as a dielectric layer, so as to serve as a stress-buffering device. However, generally this kind of insulating material is a polymer material; therefore, although the material is characterized by a low E, it has a relatively large CTE. Considering the temperature cycling of the reliability, the wire in the thickness direction tends to endure large stress and dramatic deformation due to the large amount thermal expansion of the insulating material. At present, a common conventional method of solving this problem is to increase the thickness of the wall of the wire in the thickness direction or to fill the blind vias by plating the metal material so as to solve the problem of poor reliability. However, when the insulating material with a low E serves as a stress-buffering device, the stress buffering effect will be increased as the thickness of the insulating material is increased, whereas the ratio of depth to width of the wire in the thickness direction will be excessively large. Therefore, the problem resulting from the innate material cannot be effectively alleviated even if the structure which is designed with enlarged wall thickness or blind vias filled with metal materials is employed.

As shown in U.S. Pat. No. 6,586,822 and U.S. Pat. No. 6,586,836, which disclose a structure of embedding a chip in an organic substrate, wherein a flex component interposer is provided in both patents to serve as a stress absorbing layer, thereby overcoming the problems of stress and strain to be confronted with.

SUMMARY OF THE INVENTION

In view of the above problems, the object of the present invention is to provide a structure for reducing stress for vias and a fabricating method thereof, thereby to solve the problem of failing to effectively withstand the stress and strain resulting from the innate material disclosed in the prior art.

Therefore, in order to achieve the above object, the structure for reducing stress for vias disclosed in the present invention comprises an insulation layer, a stress block, a first conductor, a second conductor, and a via. The stress block is disposed in the insulation layer and is in a lattice structure. The first conductor and the second conductor are respectively disposed on the two sides of the insulation layer. The via passes through the interior of the stress block and run through the insulation layer to connect the first conductor and the second conductor. Thus, the shear stress generated by the insulation layer under temperature loading can be blocked or absorbed by the stress block, thereby protecting the via and thus improving the reliability of the via and electronic elements.

Wherein, the lattice structure has one or more frames, and each frame is provided with one or more vias passing therethrough. Herein, the frames can be of various shapes such as rectangle, quasi rectangle, circle, quasi circle, triangle, and polygon.

Furthermore, the CTE of the stress block is less than the CTE of the insulation layer. The material parameter, for example E and CTE, of the stress block is approximate to that of the second conductor. However, the material of the stress block can be metal or nonmetal. Besides, the vias can be vias in a wire form, a through form, or a blind via form.

The present invention further discloses a fabricating method of the structure for reducing stress for vias. The method comprises the following steps: first, providing a first conductor; then, forming a stress block at the position corresponding to the first conductor, wherein the stress block is in a lattice structure; then, forming an insulation layer to cover, the first conductor, and the stress block; and forming a through hole passing through the interior of the stress block in the insulation layer corresponding to the first conductor; finally, forming a second conductor on the insulation layer, and forming a via in the through hole to connect the first conductor and the second conductor with the via.

Thus, the first conductor can be disposed on a substrate or on an insulation layer.

The lattice structure has one or more frames, and each frame is provided with one or more vias passing therethrough. Herein, the frames can be of various shapes, such as rectangle, quasi rectangle, circle, quasi circle, triangle, and polygon.

Furthermore, the CTE of the stress block is less than the CTE of the insulation layer. The material parameter, for example E and CTE, of the stress block is approximate to that of the second conductor. However, the material of the stress block can be metal or nonmetal, and the vias can be vias in a wire form, a through form, or a blind via form.

Herein, the stress block can be formed through mask electroplating, lamination, bonding, conjunction or adhesion, and the like. Furthermore, the through hole can be formed in the insulation layer through mechanical hole boring, chemical etching, laser hole drilling, and the like.

The related features and practices of the present invention are illustrated in detail in the most preferred embodiment in conjunction with the drawings.

DETAILED DESCRIPTION OF THE INVENTION

Figure 1A:
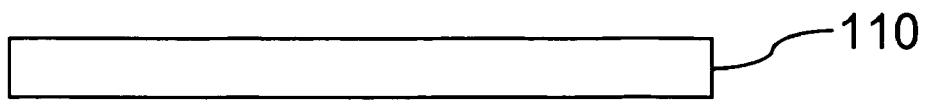
FIGS. 1A to 1G are flowcharts of the fabricating method of the structure for reducing stress for vias according to one embodiment of the present invention.

Herein, the method is mainly to enframe the wire in the thickness direction with a frame at the location adjacent to the wire structure (namely, via) in the thickness direction, so as to isolate the wire from contacting directly with the major portion of the material of a high CTE (Coefficient of Thermal Expansion). Therefore, the thermal expansion and the thermal stress resulted from different CTE of the materials of the electronic device or element can be "blocked" from the wire in the thickness direction within a fixed range, or be absorbed. Thus, the shear stress resulted from the CTE under temperature loading cannot have a direct effect on the wire in the thickness direction, thereby it is quite helpful in the long-time reliability required by the electronic devices or elements, regardless of the process, or the consumers. Therefore, the present invention can be extensively applied to various packaging structures such as Chip Size Package (CSP), Ball Grid Array (BGA) package, Wafer Level Chip Scale Package (WLCSP), Chip in Substrate Package (CiSP), and any other structures required for chip redistribution.

The content of the present invention will be described in detail with embodiments and accompanying drawings. The denotations mentioned in the description refer to the denotations in the drawings.

Figure 1B:
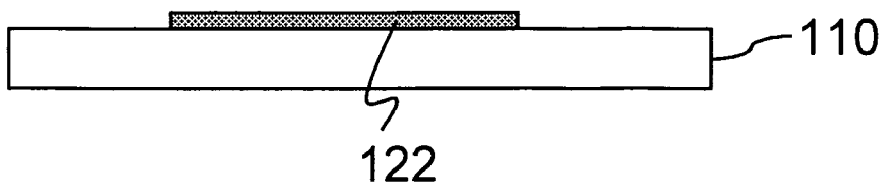
Figure 1C:
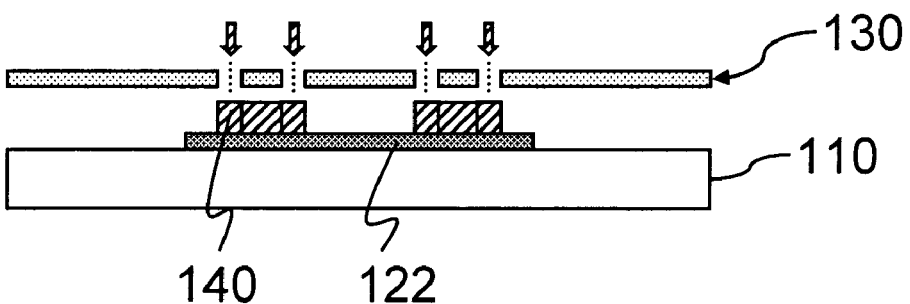
Figure 1D:
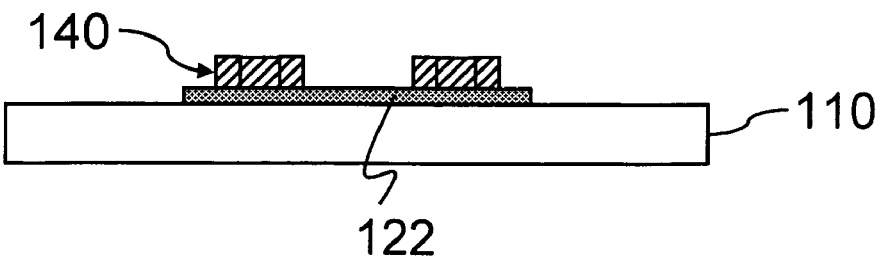
Figure 1E:
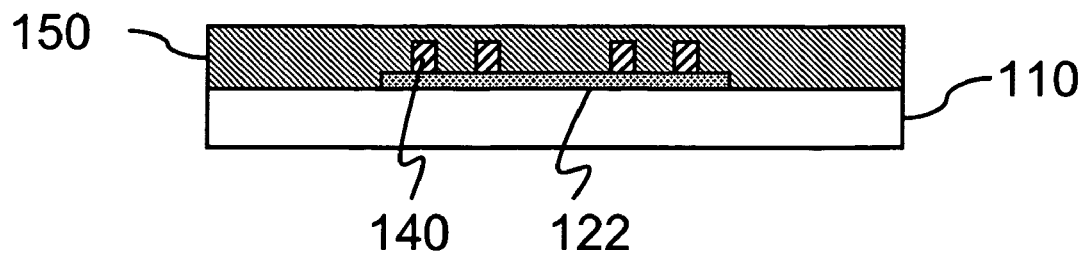
Figure 1F:
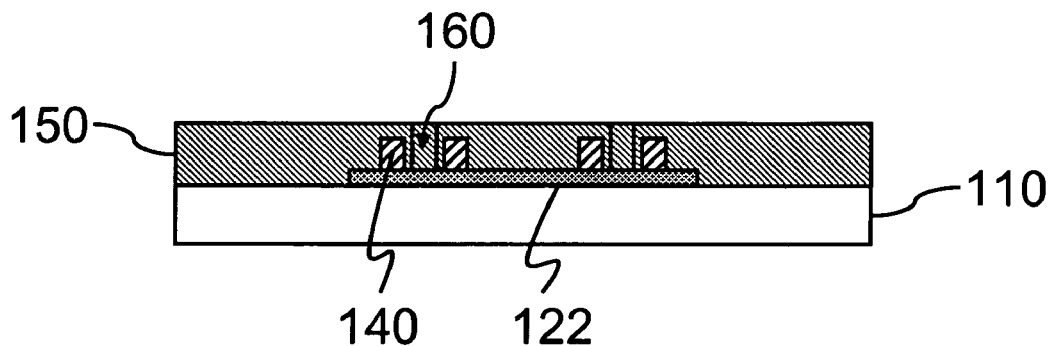
Figure 1G:
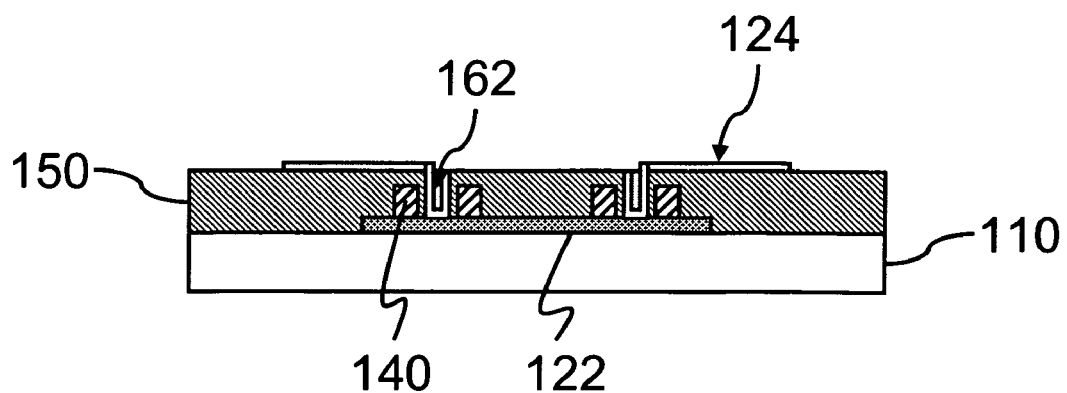

Refer to FIGS. 1A to 1G, which show the fabricating method of the structure for reducing stress for vias according to one embodiment of the present invention. First, a substrate 110 is provided, as shown in FIG. 1A. And, a first conductor 122 is formed on the substrate 110, as shown in FIG. 1B. Subsequently, the electroplating is carried out with the mask 130 corresponding to the required lattice structure as a shield mask (as shown in FIG. 1C); thereby a stress block 140 with the required lattice structure is formed (as shown in FIG. 1D). Then, an insulation layer 150 is formed to cover on the substrate 110, the first conductor 122, and the stress block 140, as shown in FIG. 1E. And, a hole is provided above the first conductor 122 in order to enable the insulation layer 150 to be formed with a through hole 160 passing through the interior of the stress block 140, as shown in FIG. 1F, wherein the through hole 160 can be formed through mechanical hole boring, chemical etching, laser hole drilling, and the like. Finally, a metal is plated to fill the through hole 160 or a layer of metal is plated only on the inside wall of the through hole 160, thereby a via 162 in a wire form, a through form, or a blind via form can be formed. A second conductor 124 is formed on the insulation layer 150, and the first conductor 122 and the second conductor 124 are connected with the via 162, as shown in FIG. 1G.

Figure 2:
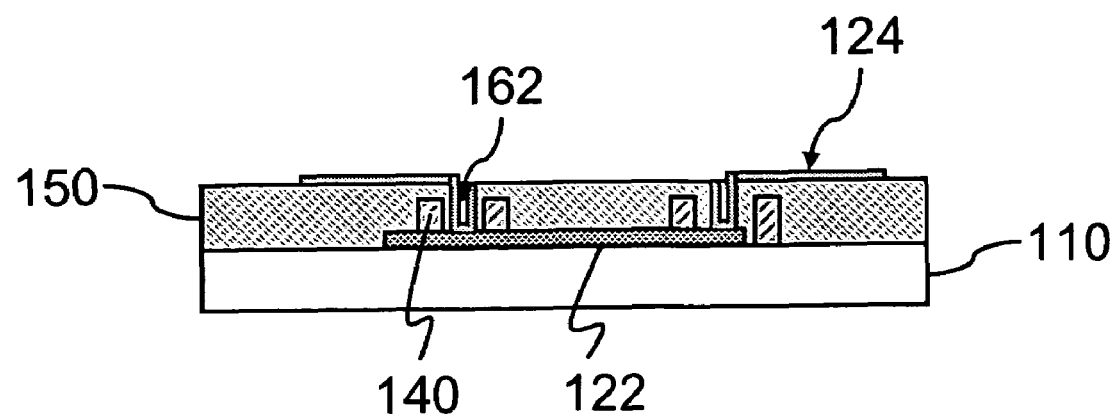
FIG. 2 is a schematic view of a structure for reducing stress for vias according to one embodiment of the present invention.

The stress block 140 will be disposed corresponding to the position of the first conductor 122 to facilitate the forming of the following via 162. In other words, the stress block 140 can be formed on the first conductor 122 or the substrate 110 depending on where the following via 162 for connecting the first conductor 122 is to be disposed, as shown in FIG. 2.

Herein, since the stress block 140 is required to be able to block or absorb the shear stress generated by the insulation layer 150 under temperature loading, the CTE of the stress block 140 is less than the CTE of the insulation layer 150. Furthermore, the material parameter, for example E and CTE, of the stress block 140 approximate to that of the second conductor 124. However, the material of the stress block 140 can be metal or nonmetal.

The substrate 110 can be an organic substrate, a semiconductor substrate, a wafer, and the like. The first conductor 122 and the second conductor 124 can be the conductive wires or the microelectronic dies, and the materials thereof are all metals, such as copper, gold, and the like.

Figure 3A:
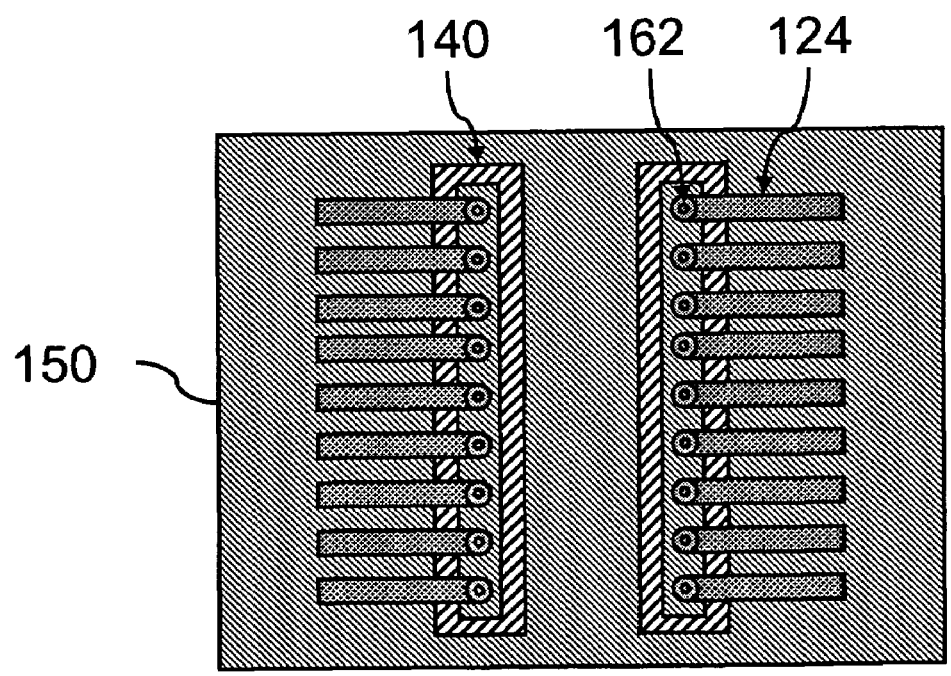
FIG. 3A is a schematic view of a structure for reducing stress for vias according to another embodiment of the present invention.
Figure 3B:
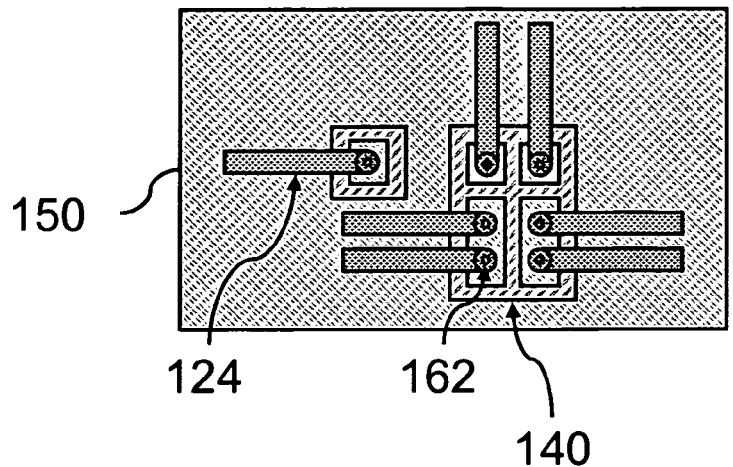
FIG. 3B is a schematic view of a structure for reducing stress for vias according to another embodiment of the present invention.
Figure 3C:
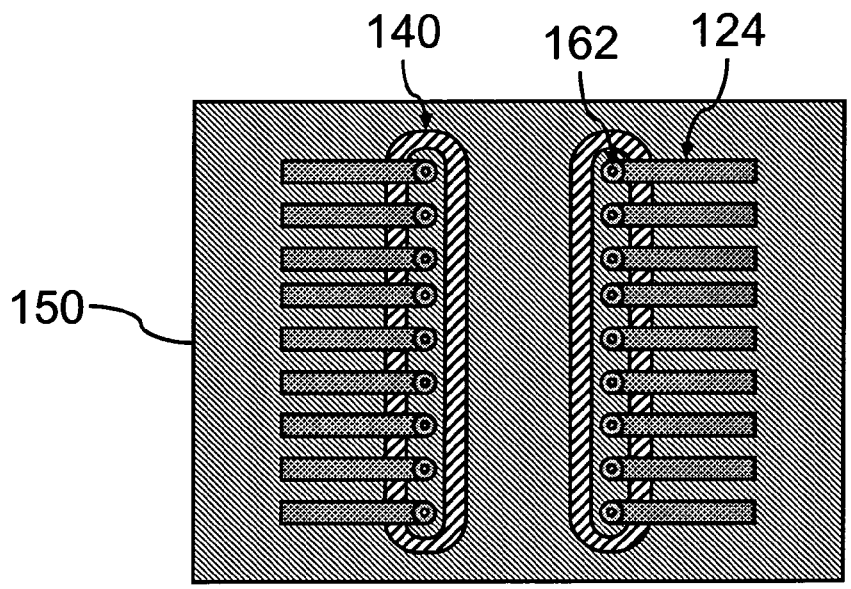
FIG. 3C is a schematic view of a structure for reducing stress for vias according to still another embodiment of the present invention.

Herein, one or more vias 162 may be provided in the lattice-structural frame formed by the each stress block 140, as shown in FIGS. 3A and 3B. In other words, there can be one or more vias 162 passing through the interior of a stress block 140. The lattice structure of each stress block 140 can be composed of a single frame or a plurality of frames, as shown in FIG. 3B. Moreover, although only the frames in rectangle shape (as shown in FIGS. 3A and 3B) and quasi rectangle shape (as shown in FIG. 3C) are shown in the drawings, the shapes of the frames used in practical can be the shapes such as circle, quasi circle, triangle, or polygon (not shown). When the lattice structure is in a structure having a plurality of frames, a combination of frames in one or more shapes can be provided in the same lattice structure (not shown).

Figure 4:
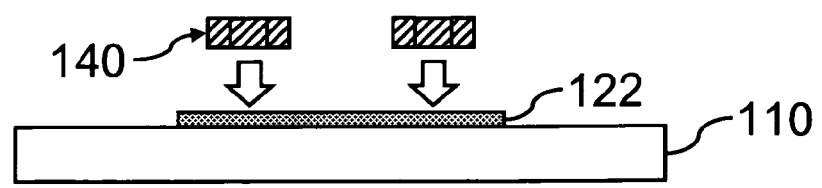
FIG. 4 is a schematic view of one embodiment of forming the stress block according to the fabricating method of the structure for reducing stress for vias of the present invention.

Moreover, the stress block 140 with required lattice structure can be first formed according to the shapes required. After the first conductor 122 is formed on the substrate 110 (as shown in FIG. 1B), the formed stress block 140 is patched on the substrate 110 at the position corresponding to the first conductor 122 through lamination, bonding, conjunction or adhesion, as shown in FIG. 4. Then the insulation layer 150, the vias 162 and the second conductor 124 are formed in sequence, as shown in FIGS. 1E, 1F and 1G.

Figure 5:
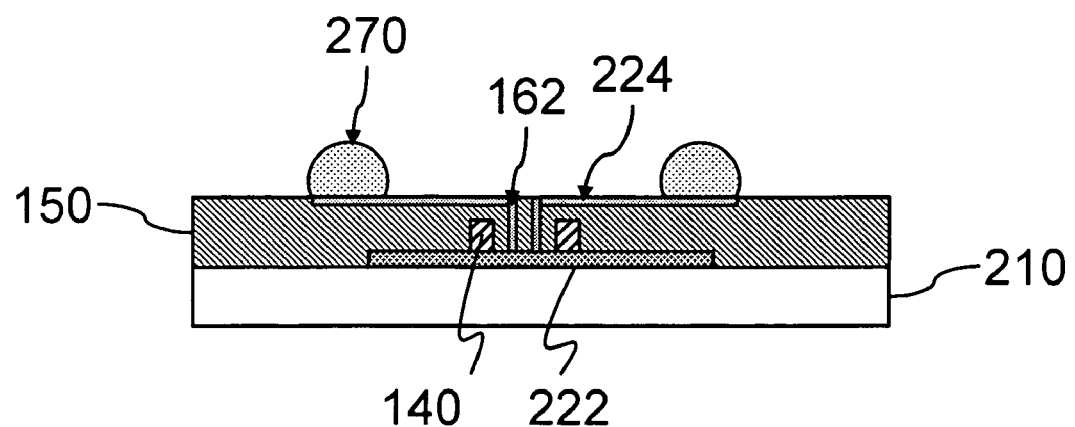
FIG. 5 is a schematic view of an example employing the electronic packaging according to the present invention.

For example, one embodiment according to the present invention is employed in the electronic packaging. Referring to FIG. 5, an electronic device 222, for example a microelectronic die, is disposed on an organic substrate 210, and an insulating material is covered thereon as an insulation layer 150. One end of a conductive line 224 on the insulation layer 150 is electrically connected to the electronic device 222 below the insulation layer 150 by the via 162 running through the insulation layer 150, and a stress block 140 is provided around the via 162 to block or absorb the shear stress generated by the insulation layer 150 under temperature loading, thus improving the reliability of the via and the electronic element. Finally, a solder joint 270 is formed on the other end of the conductive line 224 to connect the electronic packaging to the circuit board. Furthermore, when copper is used as the material of the stress block and the via of this structure, a stress simulating test is carried out on this structure (that is, a structure with a stress block) and on the structure without a stress block. Then, it can be obtained that the maximum shear stress at the via generated by the structure with a stress block is 186 MPa, while the maximum shear stress at the via generated by the structure without a stress block is 356 MPa. Therefore it can be acknowledged that the maximum generated shear stress is reduced by 47.6 percent (%). Moreover, the Von Mises stress is also reduced by 23%, and the peeling stress is reduced by 26% as well.

Figure 6:
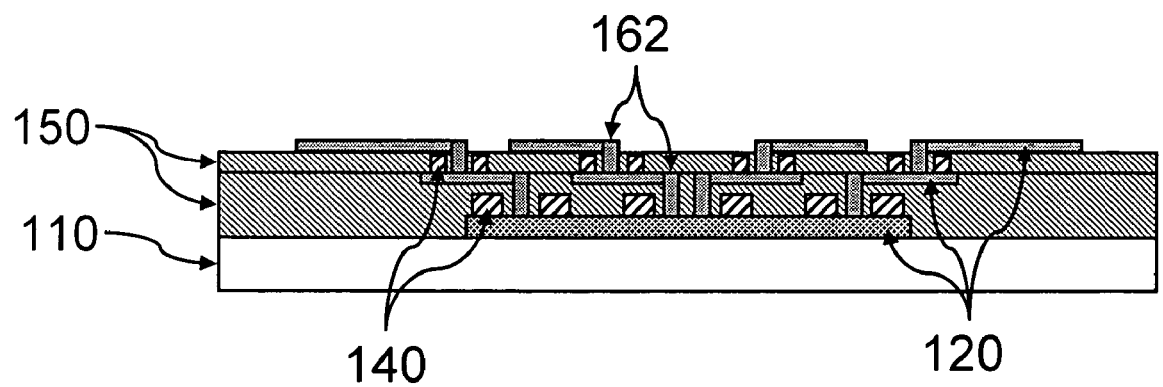
FIG. 6 is a schematic view of the structure for reducing stress for vias according to still another embodiment of the present invention.

Herein, the structure for reducing stress for vias can be a single-layer structure or a multilayer structure, that is, a plurality of insulation layers 150 is disposed on the substrate 110 in sequence, and one or more conductors 120 are provided between each layer. The conductors 120 of different layers are electrically connected by the via 162 running through the insulation layer 150. The stress blocks 140 are provided in the insulation layer 150 near the vias 162, and each stress block 140 can surround one or more vias 162, as shown in FIG. 6. Moreover, in FIG. 6, although it is only shown that every two conductors of two adjacent layers can be connected with the via, in fact, the two conductors from two nonadjacent layers can also be connected with the via.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A structure for reducing stress for vias, comprising:
   a microelectronic die;
   an insulation layer, disposed on the microelectronic die;
   at least a stress block, disposed in the insulation layer and in a lattice structure;
   at least a conductive line, disposed on the insulation layer; and
   at least a via, passing through the interior of the stress block and running through the insulation layer, and connecting the conductive line to the microelectronic die.

2. The structure for reducing stress for vias as claimed in claim 1, wherein the lattice structure includes at least a frame, and each frame is provided with at least one of the vias passing therethrough.

3. The structure for reducing stress for vias as claimed in claim 2, wherein the shape of each frame is selected from the group consisting of rectangle, quasi rectangle, circle, quasi circle, triangle, and polygon.

4. The structure for reducing stress for vias as claimed in claim 1, wherein the coefficient of thermal expansion (CTE) of the stress block is less than the CTE of the insulation layer.

5. The structure for reducing stress for vias as claimed in claim 1, wherein the type of the via is selected from the group consisting of a wire form, a through form, and a blind via form.

* * * * *

UNITED STATES PATENT AND TRADEMARK OFFICE
CERTIFICATE OF CORRECTION

PATENT NO. : 7,545,039 B2
APPLICATION NO. : 11/410986
DATED : June 9, 2009
INVENTOR(S) : Hsu et al.

Page 1 of 1

It is certified that error appears in the above-identified patent and that said Letters Patent is hereby corrected as shown below:

On The Title Page, Item (73) Assignee's residence:

"Industrial Technology Research Institute, Hsinchu (CN)" should be changed to --Industrial Technology Research Institute, Hsinchu (TW)--

Signed and Sealed this
Third Day of March, 2015

Michelle K. Lee
*Deputy Director of the United States Patent and Trademark Office*